US012733118B2

(12) United States Patent
Lau et al.

(10) Patent No.: US 12,733,118 B2
(45) Date of Patent: Sep. 8, 2026

(54) DUAL-SCREW ASSEMBLY FOR DEVICE HOUSING

(71) Applicant: Microsoft Technology Licensing, LLC, Redmond, WA (US)

(72) Inventors: Daniel T Lau, San Jose, CA (US); Xiaoyi Ma, Stanford, CA (US); Nicholas Zell, San Jose, CA (US); Andres Ramos, San Francisco, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 133 days.

(21) Appl. No.: 18/905,842

(22) Filed: Oct. 3, 2024

(65) Prior Publication Data

US 2026/0101460 A1 Apr. 9, 2026

(51) Int. Cl.
*H05K 5/06* (2006.01)
*H05K 5/00* (2025.01)
*H05K 5/13* (2025.01)

(52) U.S. Cl.
CPC ........... *H05K 5/061* (2013.01); *H05K 5/0017* (2013.01); *H05K 5/13* (2025.01)

(58) Field of Classification Search
CPC combination set(s) only.
See application file for complete search history.

(56) References Cited

U.S. PATENT DOCUMENTS 6,266,685 B1 * 7/2001 Danielson ............. G06F 1/3293 361/679.56
6,504,710 B2 * 1/2003 Sutton ................... G06F 1/1656 361/679.41
10,199,718 B2 * 2/2019 Khalifa .................. H01Q 13/10
10,966,331 B2 * 3/2021 Roth .................... H04B 1/3888
11,071,216 B1 * 7/2021 Roth .................... H04B 1/3888
11,268,552 B2 * 3/2022 Clavelle ................ F16B 37/045
11,788,677 B2 * 10/2023 Li .......................... F16M 11/20 361/679.02
11,790,812 B2 * 10/2023 Li ....................... G02F 1/13336 361/679.02
12,317,431 B2 * 5/2025 Roth .................... H04B 1/3888
12,326,567 B2 * 6/2025 Skye .................. G02B 27/0176
2002/0034058 A1 * 3/2002 Newton ................ B60T 13/665 361/1
2013/0265697 A1 * 10/2013 Taylor .................. H05K 5/0095 361/679.01
2015/0227178 A1 * 8/2015 Rayner ................. G06F 1/1635 361/679.02
2016/0072178 A1 * 3/2016 Khalifa .................... H01Q 1/36 343/702
2018/0322708 A1 * 11/2018 Luccin .................... G06T 19/20

(Continued)

*Primary Examiner* — Lisa Lea-Edmonds
(74) *Attorney, Agent, or Firm* — Alleman Hall LLP

(57) ABSTRACT

An electronic device includes a device housing and a secondary component removably affixed to the device housing. A dual screw assembly is used to affix the secondary component to the device housing. The dual screw assembly includes a first screw inserted into a housing aperture of the device housing, such that a portion of the first screw extends into an interior of the device housing, and a second screw inserted into a screw aperture formed within a head of the first screw, such that at least a portion of the secondary component is positioned between a head of the second screw and the head of the first screw.

20 Claims, 4 Drawing Sheets

(56) References Cited

U.S. PATENT DOCUMENTS

| | | | | |
|---|---|---|---|---|
| 2020/0236799 | A1* | 7/2020 | Roth | H04B 1/3888 |
| 2021/0204422 | A1* | 7/2021 | Roth | H04B 1/3888 |
| 2021/0337679 | A1* | 10/2021 | Roth | H04B 1/3888 |
| 2024/0053614 | A1* | 2/2024 | Skye | G02B 27/0176 |
| 2024/0201505 | A1* | 6/2024 | Skye | G02B 27/0149 |
| 2025/0054712 | A1* | 2/2025 | Lin | H01H 13/85 |

* cited by examiner

DUAL-SCREW ASSEMBLY FOR DEVICE HOUSING

BACKGROUND

When electronic devices are used in outdoor environments, it is typically desirable for the housings of such devices to be sealed, thereby preventing moisture, dust, and debris from entering. Furthermore, depending on their use-case, it may be desirable for such devices to be rugged and resistant to external physical forces, ensuring long-term durability and functionality.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

An electronic device includes a device housing and a secondary component removably affixed to the device housing. A dual screw assembly is used to affix the secondary component to the device housing. The dual screw assembly includes a first screw inserted into a housing aperture of the device housing, such that a portion of the first screw extends into an interior of the device housing, and a second screw inserted into a screw aperture formed within a head of the first screw, such that at least a portion of the secondary component is positioned between a head of the second screw and the head of the first screw.

DETAILED DESCRIPTION

Figure 1:
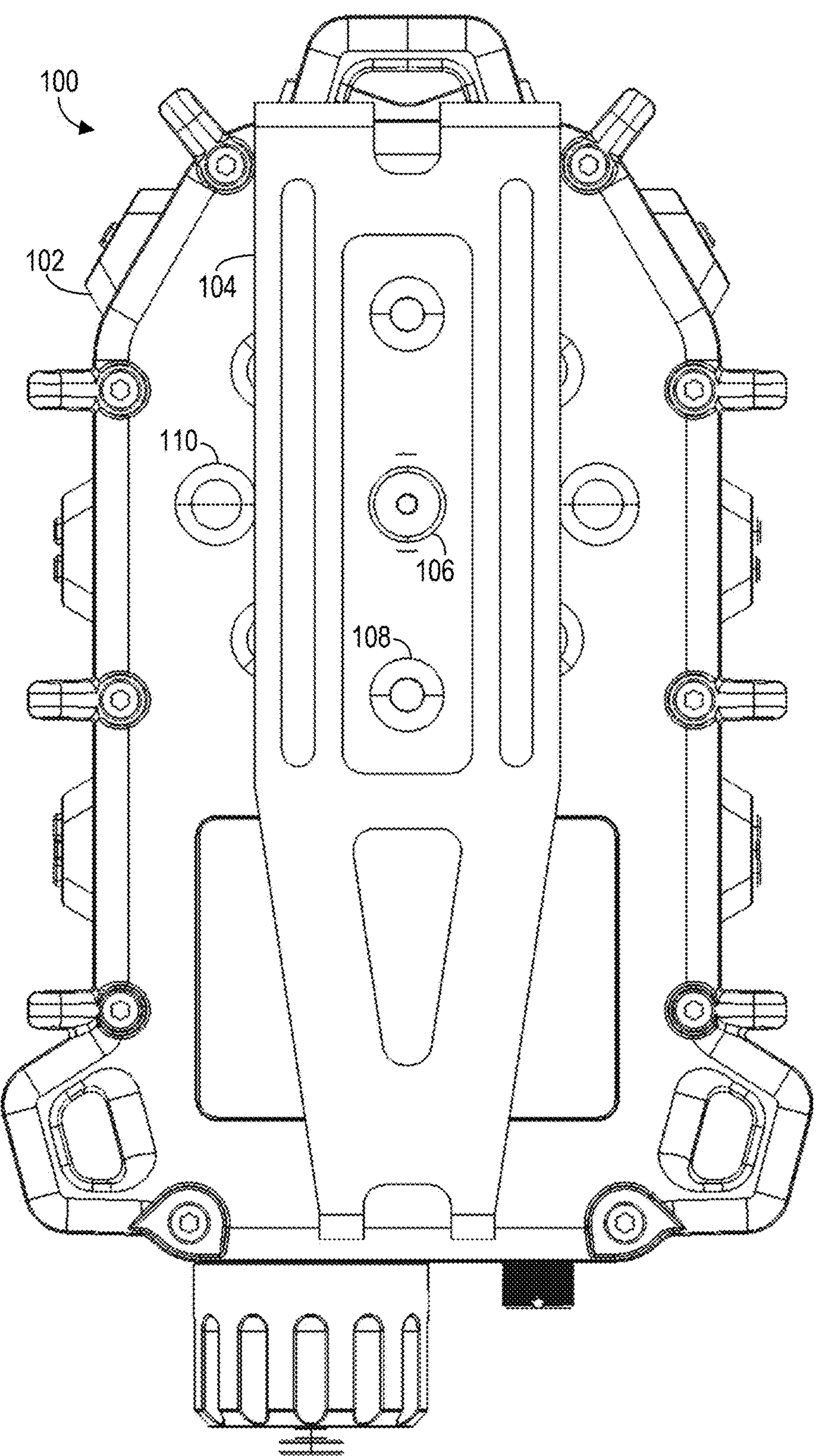
FIG. 1 shows an example electronic device, including a secondary component affixed to the device housing via a dual-screw assembly.

The present disclosure describes a dual-screw assembly useable to removably affix a secondary component to the housing of an electronic device. Particularly, as will be described in more detail below, the dual-screw assembly includes a first screw inserted into an aperture of the device housing, such that a portion of the first screw extends into the interior of the device. Additionally, another aperture is formed in the head of the first screw, enabling insertion of a second, smaller screw into the first screw. The second screw extends through a hole in the secondary component, such that at least a portion of the secondary component is positioned between the head of the second screw and the head of the first screw, thereby holding the secondary component in place.

As one non-limiting example, the electronic device may take the form of an input device used to control a computing system. For instance, as will be described in more detail below, the electronic device may include one or more input mechanisms that, when actuated, provide user input to a separate computing device communicatively coupled with the electronic device via a communications interface. In one non-limiting example scenario, the computing device takes the form of a head-mounted display device intended for use in outdoor environments, and the input device serves as a controller for providing input to the head-mounted display device. The secondary component affixed to the electronic device using the dual-screw assembly may take the form of an attachment clip, useable to attach the electronic device to another object, such as a user's clothing.

In this scenario, it may be desirable for the input device to have a relatively rugged, durable design that can withstand rough environmental conditions. As such, in some examples, the dual-screw assembly provides a hermitic seal between the interior of the device and an external atmosphere, which can beneficially improve the durability of the electronic device, especially when used in outdoor environments. Furthermore, the dual-screw assembly may beneficially improve the resilience of the electronic device to external physical forces—e.g., in the event of significant rotational force applied to the secondary component, the second screw may loosen before the first screw, without compromising the seal provided by the first screw. In this manner, the second screw may serve as a sacrificial screw for the dual-screw assembly.

However, it will be understood that the dual-screw assemblies described herein may be used with any suitable electronic devices, having any suitable capabilities, form factor, and hardware configuration. Furthermore, a dual-screw assembly as described herein may be used to removably affix any suitable type of secondary component to the electronic device. In the above example, the secondary component is a clip designed to secure the electronic device to a person's clothing (e.g., such as a vest). As another example, the secondary component may take the form of a mounting bracket, which enables the device to be affixed to a stationary object, such as a wall or vehicle dashboard, for ease of access or stable positioning. Additionally, the dual-screw assembly could be used to attach protective covers or shields that enhance the durability of the device by providing extra protection against physical impacts or environmental exposure. Other potential secondary components include cable management clips for securing wires or connectors, accessory holders designed to carry peripheral devices like styluses or small tools, etc.

The dual screw assembly may beneficially provide multipurpose utility for the electronic device. As discussed above, the dual screw assembly may enable hermetic sealing of the interior of the electronic device, while still enabling attachment of a secondary component. As will be described in more detail below, aspects of the dual screw assembly may form a portion of an electrical grounding path for internal components of the electronic device. In some examples, the dual screw assembly may be used for pressure testing and/or liquid/gas transfer (e.g., nitrogen filling).

FIG. 1 shows an example electronic device 100. It will be understood that electronic device 100 is one non-limiting example of an electronic device that may incorporate a dual-screw assembly as described herein. As shown, electronic device 100 includes a device housing 102, and a secondary component 104 attached to the device housing. In this non-limiting example, the secondary component is an attachment clip for attaching the electronic device to another object, such as a person's clothing.

The secondary component is removably affixed to the device housing via a dual screw assembly 106. As will be described in more detail below, the dual screw assembly includes a first screw inserted into a housing aperture of the device housing, and a second screw inserted into a screw aperture formed in the head of the first screw. The second screw extends through a hole in the secondary component, such that at least a portion of the secondary component is sandwiched between the head of the second screw and the head of the first screw, thereby affixing the secondary component to the device housing.

In some examples, the dual screw assembly enables rotation of the secondary component about an insertion axis of the dual screw assembly. This can beneficially serve to improve the flexibility with which the electronic device can be attached to other objects. Furthermore, the secondary component may include one or more divots that fit into corresponding detents in the surface of the electronic device at different positions of the secondary component. For instance, in FIG. 1, the secondary component 106 includes two divots, one of which is labeled as divot 108. The device housing includes several corresponding detents, one of which is labeled as detent 110. This enables the secondary component to be retained at various different rotational angles relative to the device housing.

Figure 2:
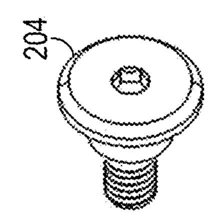
FIG. 2 shows an exploded view of aspects of a dual-screw assembly.
Figure 2:
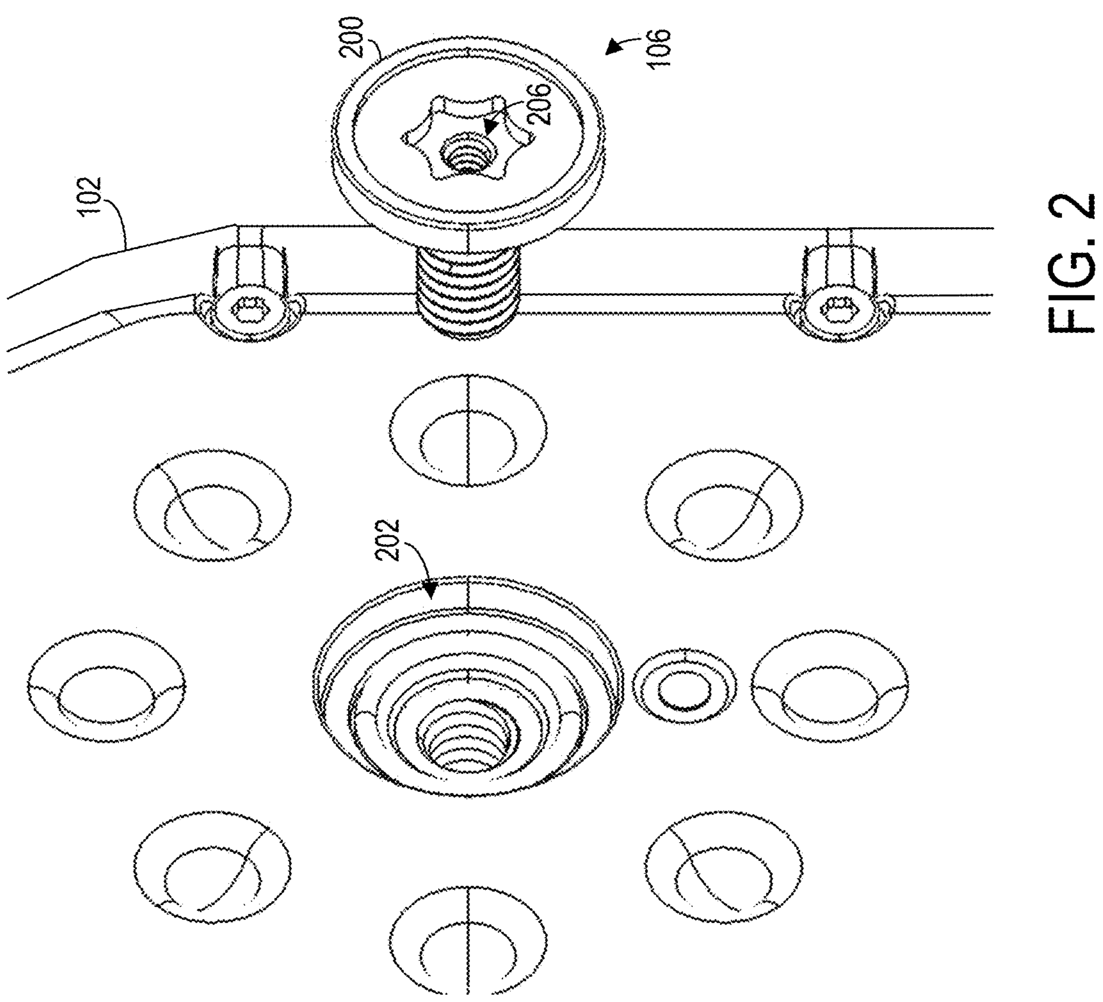

FIG. 2 shows an exploded view of aspects of the dual screw assembly 106. As shown, the dual screw assembly includes a first screw 200. The first screw is inserted into a housing aperture 202 of the device housing 102, such that a portion of the first screw extends into the interior of the device housing. The dual screw assembly additionally includes a second screw 204, smaller than the first screw. The second screw is inserted into a screw aperture 206 formed within the head of the first screw. The secondary component is omitted in FIG. 2 for visual clarity. However, as discussed above, the second screw extends through the secondary component, such that at least a portion of the secondary component is positioned between the heads of the first and second screws.

Figure 3:
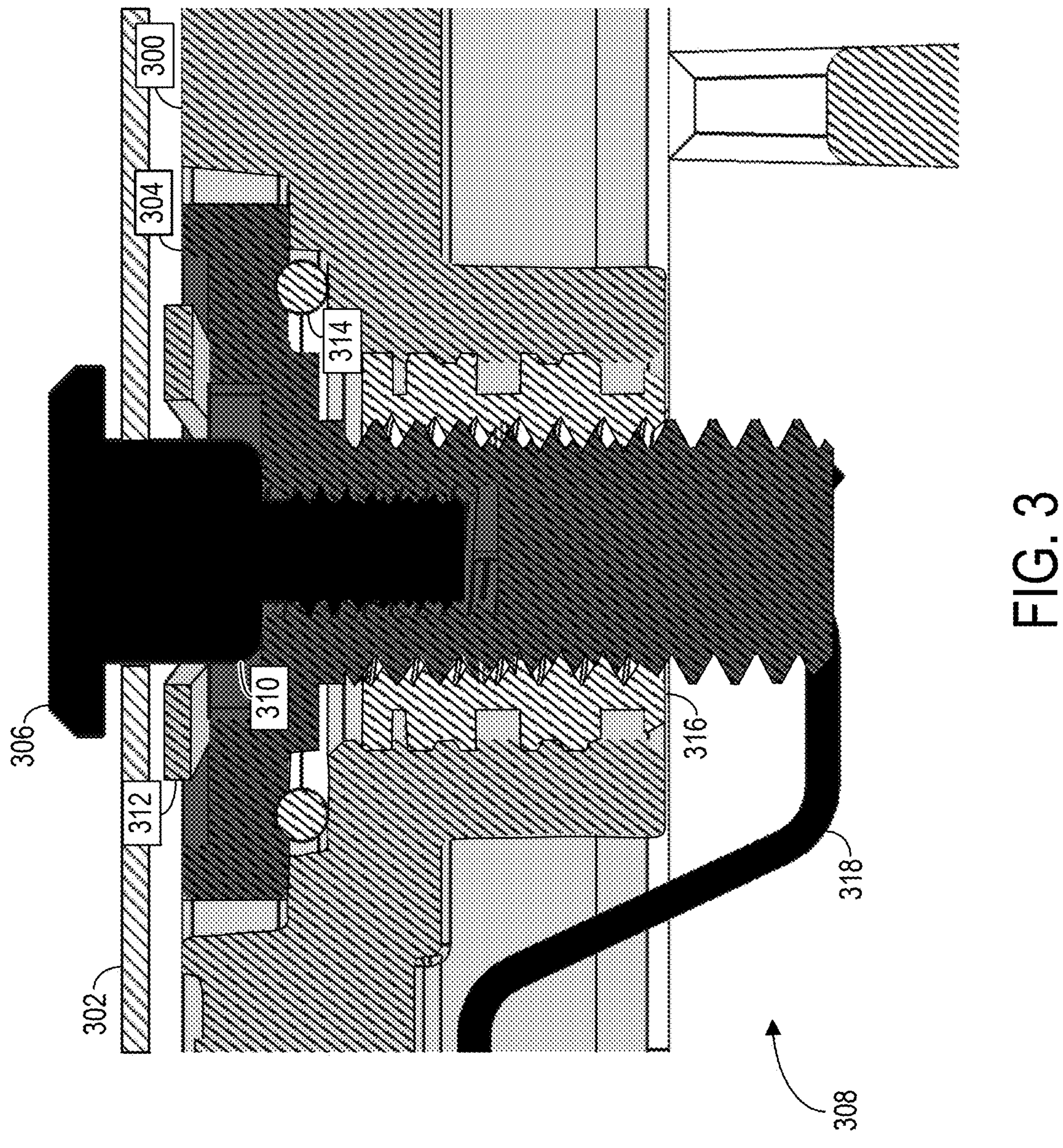
FIG. 3 shows a cross-sectional view of aspects of a dual-screw assembly.

FIG. 3 shows a cross-sectional view of aspects of an example electronic device including a dual screw assembly. Specifically, FIG. 3 shows a device housing 300 of an electronic device, and a secondary component 302 removably affixed to the device housing. The secondary component is affixed using a dual screw assembly, which includes a first screw 304 and a second screw 306. The first screw is inserted into an aperture of the device housing, such that a portion of the first screw extends into an interior 308 of the device housing. The second screw is inserted into an aperture formed in the head of the first screw, such that a portion of the second screw extends into the first screw. The secondary component 302 is positioned between the head of the first screw 304 and the head of the second screw 306.

In this example, insertion of the second screw into the first screw is limited by a spacer. Specifically, in FIG. 3, the spacer takes the form of a shoulder 310 that limits insertion of the second screw into the first screw. This can facilitate rotation of the secondary component relative to the device housing, as discussed above. For instance, use of the shoulder 310 can prevent the second screw from being inserted far enough into the first screw to provide a substantial clamping force that would prevent rotation of the secondary component. In other examples, however, other suitable types of spacers may be used. For instance, the spacer may take the form of a cylindrical piece placed around the threads of the second screw. In general, any suitable component may be used for defining a controlled gap between the second screw and the first screw.

In this example, the dual screw assembly additionally includes a spring washer 312 disposed between the first screw 304 and the secondary component 302. The spring washer may beneficially maintain tension against the secondary component. In this manner, the spring washer can provide resilience to loosening of the dual screw assembly due to external forces or vibrations, and constrain unintended movement of the secondary component relative to the device housing (e.g., other than intended rotational movement). In some examples, the spring washer may additionally provide a portion of an electrical grounding path—e.g., it may serve to ground internal components of the electronic device to the secondary component.

As discussed above, the dual screw assembly may maintain a hermitic seal between the interior 308 of the device housing and the external environment. This may beneficially improve the resilience of the electronic device when used in outdoor environments—e.g., preventing moisture, dust, and debris from entering the interior of the electronic device. To this end, in FIG. 3, the dual screw assembly includes a sealing gasket 314 disposed between the head of the first screw 304 and the device housing 300, which may prevent ingress of foreign materials into the device interior. Notably, the sealing gasket may continue to provide the hermetic seal between the interior of the device housing and the external environment, even if the second screw and secondary component are removed. This can beneficially facilitate removal of the secondary component, and/or replacement of the secondary component, without compromising the device interior.

Furthermore, as discussed above, the second screw may in some cases serve as a sacrificial screw—e.g., significant rotational force applied to the secondary component may cause the second screw to loosen before the first screw. In this manner, the hermetic seal may be maintained even if the electronic device is exposed to significant physical forces—e.g. in a rugged outdoor environment.

The various components of the dual screw assembly may each be constructed from any suitable materials, such as suitable plastics, metals, ceramics, etc. In one non-limiting example, the device housing is constructed from plastic, which may provide a good balance between weight, cost, and durability. In any case, depending on the material from which the device housing is constructed, it may be desirable to incorporate a threaded insert within interior of the device housing, where the first screw is threaded into the threaded insert. This can improve the durability and robustness of the dual screw assembly—e.g., in cases where the threaded insert is constructed from a more durable material than the device housing. For instance, in one example scenario, the device housing may be constructed from plastic, while the threaded insert is metallic. In FIG. 3, the first screw 304 is threaded into a threaded insert 316, which may improve the durability of the dual screw assembly as discussed above.

In FIG. 3, the electronic device additionally includes a grounding component 318. In this example, the grounding component includes a metallic grounding clip that contacts a distal portion of the first screw 304 (distal relative to the head of the screw) within the interior 308 of the electronic device. In this manner, the grounding component and the first screw together form a portion of an electrical grounding path for other components within the electronic device. For instance, as discussed above, the spring washer contacting the first screw and the secondary component may also form a portion of the grounding path, thereby grounding the first screw to the secondary component. While a metallic grounding clip is one non-limiting example, additional or alternative grounding components may be used. For instance, in other examples, the grounding component may take the form of conductive fabric-wrapped foam, the distal end of the first screw may include a spring-loaded plunger, and/or the screw may contact a non-flexible metallic component inside the device. For instance, the screw may terminate against a block of metal that serves as a grounding component.

As discussed above, the electronic device may in some examples function as an input device, useable to provide user inputs to a separate computing device. This is schematically illustrated with respect to FIG. 4, again showing electronic device 100. As shown, the electronic device includes an input subsystem 400, including a plurality of input mechanisms (e.g., directional buttons), two of which are labeled as input mechanisms 402A and 402B. It will be understood that an "input subsystem" may include any suitable number and variety of different input mechanisms, including buttons, switches, dials, touch-sensitive surfaces, etc. In general, an input mechanism refers to any suitable component useable for translating a user input into an analog or digital signal for transmission to a separate computing device.

Figure 4:
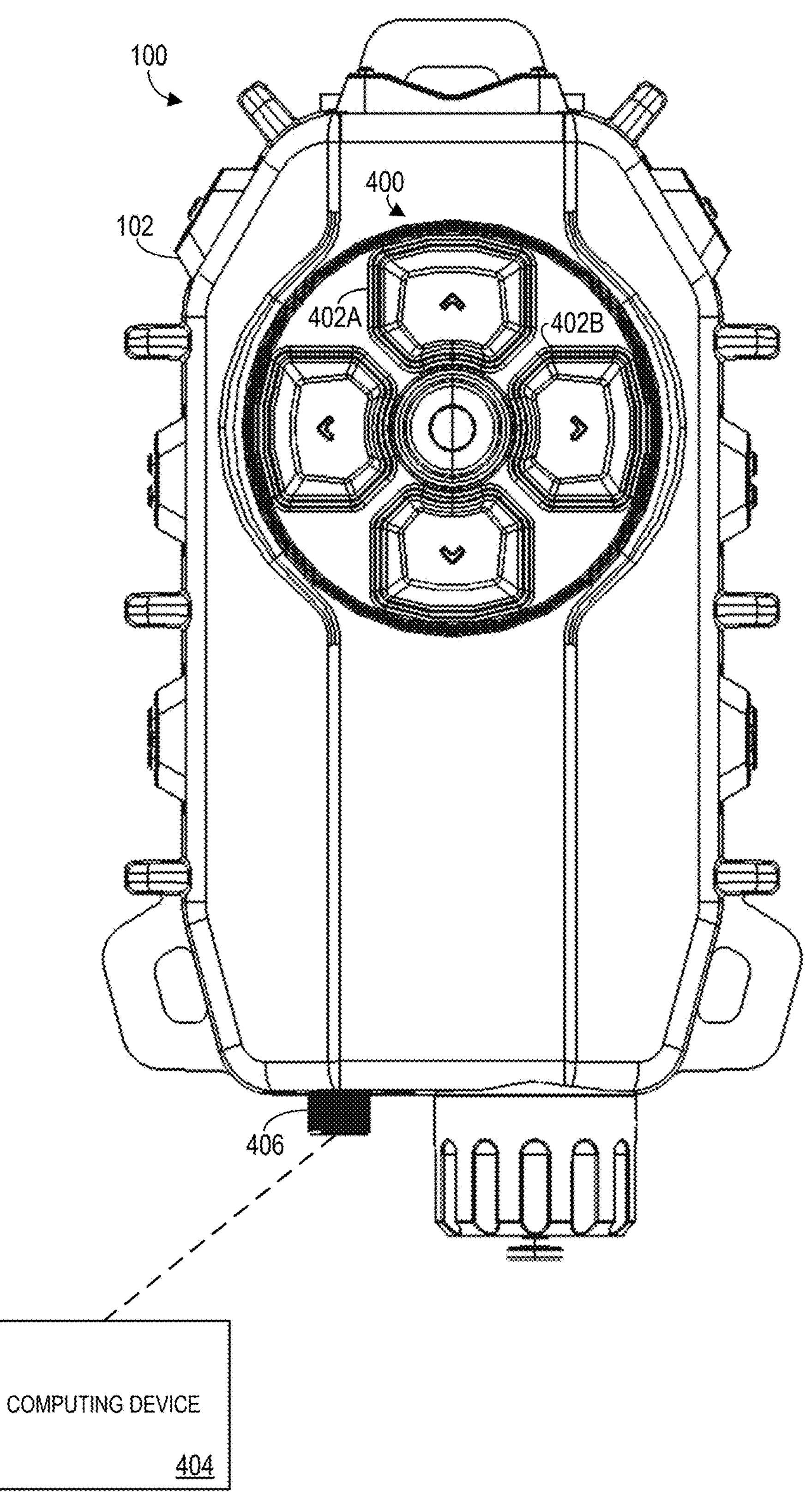
FIG. 4 shows an example electronic device, including one or more input mechanisms.

In FIG. 4, the electronic device is communicatively coupled with a separate computing device 404 via a communications interface 406. It will be understood that a "computing device" as described herein may have any suitable capabilities, hardware configuration, and form factor. As one non-limiting example, the computing device may take the form of a head-mounted display device. As other examples, the computing device may take the form of a laptop, tablet, smartphone, desktop computer, vehicle computing device, etc.

Furthermore, the electronic device and the separate computing device may be communicatively coupled via any suitable communications interface. Such an interface may be wired and/or wireless, and may facilitate any suitable exchange of analog and/or digital data between the electronic device and the separate computing device.

In an example, an electronic device comprises: a device housing; a secondary component removably affixed to the device housing; and a dual screw assembly affixing the secondary component to the device housing, the dual screw assembly including: a first screw inserted into a housing aperture of the device housing, such that a portion of the first screw extends into an interior of the device housing; and a second screw inserted into a screw aperture formed within a head of the first screw, such that at least a portion of the secondary component is positioned between a head of the second screw and the head of the first screw. In this example or any other example, the dual screw assembly includes a sealing gasket disposed between the head of the first screw and the device housing, the sealing gasket providing a hermetic seal between the interior of the device housing and an external environment. In this example or any other example, the sealing gasket continues to provide the hermetic seal between the interior of the device housing and the external atmosphere after removal of the secondary component and the second screw. In this example or any other example, insertion of the second screw into the first screw is limited by a spacer. In this example or any other example, the electronic device further comprises a spring washer disposed between the first screw and the secondary component. In this example or any other example, the electronic device further comprises a threaded insert disposed within the interior of the device housing, wherein the first screw is threaded into the threaded insert. In this example or any other example, the threaded insert is metallic. In this example or any other example, the electronic device further comprises a grounding component that contacts a distal portion of the first screw within the interior of the device housing. In this example or any other example, the dual screw assembly enables rotation of the secondary component about an insertion axis of the dual screw assembly. In this example or any other example, the secondary component is an attachment clip for attaching the electronic device to another object. In this example or any other example, the electronic device further comprises an input subsystem including one or more input mechanisms that, when manipulated, provide user input to a separate computing device communicatively coupled with the electronic device via a communications interface.

In an example, an electronic device comprises: a device housing; a secondary component removably affixed to the device housing; and a dual screw assembly affixing the secondary component to the device housing, the dual screw assembly including: a first screw inserted into a housing aperture of the device housing, such that a portion of the first screw extends into an interior of the device housing; a second screw inserted into screw aperture formed within a head of the first screw, such that at least a portion of the secondary component is positioned between a head of the second screw and the head of the first screw, wherein the dual screw assembly enables rotation of the secondary component about an insertion axis of the dual screw assembly; and a sealing gasket disposed between the head of the first screw and the device housing, the sealing gasket providing a hermetic seal between the interior of the device housing and an external environment. In this example or any other example, the sealing gasket continues to provide the hermetic seal between the interior of the device housing and the external atmosphere after removal of the secondary component and the second screw. In this example or any other example, insertion of the second screw into the first screw is limited by a spacer. In this example or any other example, the electronic device further comprises a spring washer disposed between the first screw and the secondary component. In this example or any other example, the electronic device further comprises a metallic threaded insert disposed within the interior of the device housing, wherein the first screw is threaded into the metallic threaded insert. In this example or any other example, the electronic device further comprises a grounding component that contacts a distal portion of the first screw within the interior of the device housing. In this example or any other example, the secondary component is an attachment clip for attaching the device housing to another object. In this example or any other example, the electronic device further comprises an input subsystem including one or more input mechanisms that, when manipulated, provide user input to a separate computing device communicatively coupled with the electronic device via a communications interface.

In an example, an electronic input device comprises: an input subsystem including one or more input mechanisms that, when manipulated, provide user input to a separate computing device; a communications interface communicatively connecting the electronic input device to the separate computing device; a device housing; a secondary component removably affixed to the device housing; and a dual screw assembly affixing the secondary component to the device housing, the dual screw assembly including: a first screw inserted into a housing aperture of the device housing, such that a portion of the first screw extends into an interior of the device housing; and a second screw inserted into a screw aperture formed within a head of the first screw, such that at least a portion of the secondary component is positioned between a head of the second screw and the head of the first screw.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An electronic device, comprising:

a device housing;

a secondary component removably affixed to the device housing; and a dual screw assembly affixing the secondary component to the device housing, the dual screw assembly including:

a first screw inserted into a housing aperture of the device housing, such that a portion of the first screw extends into an interior of the device housing; and a second screw inserted into a screw aperture formed within a head of the first screw, such that at least a portion of the secondary component is positioned between a head of the second screw and the head of the first screw.

2. The electronic device of claim 1, wherein the dual screw assembly includes a sealing gasket disposed between the head of the first screw and the device housing, the sealing gasket providing a hermetic seal between the interior of the device housing and an external environment.

3. The electronic device of claim 2, wherein the sealing gasket continues to provide the hermetic seal between the interior of the device housing and the external atmosphere after removal of the secondary component and the second screw.

4. The electronic device of claim 1, wherein insertion of the second screw into the first screw is limited by a spacer.

5. The electronic device of claim 1, further comprising a spring washer disposed between the first screw and the secondary component.

6. The electronic device of claim 1, further comprising a threaded insert disposed within the interior of the device housing, wherein the first screw is threaded into the threaded insert.

7. The electronic device of claim 6, wherein the threaded insert is metallic.

8. The electronic device of claim 1, further comprising a grounding component that contacts a distal portion of the first screw within the interior of the device housing.

9. The electronic device of claim 1, wherein the dual screw assembly enables rotation of the secondary component about an insertion axis of the dual screw assembly.

10. The electronic device of claim 1, wherein the secondary component is an attachment clip for attaching the electronic device to another object.

11. The electronic device of claim 1, further comprising an input subsystem including one or more input mechanisms that, when manipulated, provide user input to a separate computing device communicatively coupled with the electronic device via a communications interface.

12. An electronic device, comprising:

a device housing;

a secondary component removably affixed to the device housing; and a dual screw assembly affixing the secondary component to the device housing, the dual screw assembly including:

a first screw inserted into a housing aperture of the device housing, such that a portion of the first screw extends into an interior of the device housing;

a second screw inserted into screw aperture formed within a head of the first screw, such that at least a portion of the secondary component is positioned between a head of the second screw and the head of the first screw, wherein the dual screw assembly enables rotation of the secondary component about an insertion axis of the dual screw assembly; and a sealing gasket disposed between the head of the first screw and the device housing, the sealing gasket providing a hermetic seal between the interior of the device housing and an external environment.

13. The electronic device of claim 12, wherein the sealing gasket continues to provide the hermetic seal between the interior of the device housing and the external atmosphere after removal of the secondary component and the second screw.

14. The electronic device of claim 12, wherein insertion of the second screw into the first screw is limited by a spacer.

15. The electronic device of claim 12, further comprising a spring washer disposed between the first screw and the secondary component.

16. The electronic device of claim 12, further comprising a metallic threaded insert disposed within the interior of the device housing, wherein the first screw is threaded into the metallic threaded insert.

17. The electronic device of claim 12, further comprising a grounding component that contacts a distal portion of the first screw within the interior of the device housing.

18. The electronic device of claim 12, wherein the secondary component is an attachment clip for attaching the device housing to another object.

19. The electronic device of claim 12, further comprising an input subsystem including one or more input mechanisms that, when manipulated, provide user input to a separate computing device communicatively coupled with the electronic device via a communications interface.

20. An electronic input device, comprising:

an input subsystem including one or more input mechanisms that, when manipulated, provide user input to a separate computing device;

a communications interface communicatively connecting the electronic input device to the separate computing device;

a device housing;

a secondary component removably affixed to the device housing; and a dual screw assembly affixing the secondary component to the device housing, the dual screw assembly including:

a first screw inserted into a housing aperture of the device housing, such that a portion of the first screw extends into an interior of the device housing; and a second screw inserted into a screw aperture formed within a head of the first screw, such that at least a portion of the secondary component is positioned between a head of the second screw and the head of the first screw.

* * * * *